(12) United States Patent
Nozaki et al.

(10) Patent No.: US 11,173,555 B2
(45) Date of Patent: Nov. 16, 2021

(54) SURFACE-COATED CUTTING TOOL

(71) Applicant: NGK SPARK PLUG CO., LTD., Nagoya (JP)

(72) Inventors: Shota Nozaki, Nagoya (JP); Fumihiro Kikkawa, Nagoya (JP); Atsushi Komura, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 51 days.

(21) Appl. No.: 16/620,716

(22) PCT Filed: May 11, 2018

(86) PCT No.: PCT/JP2018/018255
§ 371 (c)(1),
(2) Date: Dec. 9, 2019

(87) PCT Pub. No.: WO2018/230212
PCT Pub. Date: Dec. 20, 2018

(65) Prior Publication Data
US 2020/0122248 A1 Apr. 23, 2020

(30) Foreign Application Priority Data
Jun. 12, 2017 (JP) .............................. JP2017-115123

(51) Int. Cl.
 *B23B 27/14* (2006.01)
 *B23C 5/20* (2006.01)
 (Continued)

(52) U.S. Cl.
 CPC ................ *B23C 5/20* (2013.01); *B23B 27/14* (2013.01); *C23C 14/0617* (2013.01);
 (Continued)

(58) Field of Classification Search
 CPC ............................ B23B 27/14; C23C 14/0641
 (Continued)

(56) References Cited

U.S. PATENT DOCUMENTS 6,767,658 B2 * 7/2004 Yamamoto .......... C23C 14/0641
428/697
2006/0154108 A1 7/2006 Fukui et al.
2010/0215912 A1 8/2010 Kubota et al.

FOREIGN PATENT DOCUMENTS

CN 104385751 A 3/2015
JP 2005-271155 * 10/2005
(Continued)

OTHER PUBLICATIONS

International Search Report (PCT/ISA/210) dated Jul. 31, 2018 issued by the International Searching Authority in International Application No. PCT/JP2018/018255.

*Primary Examiner* — Archene A Turner
(74) *Attorney, Agent, or Firm* — Sughrue Mion, PLLC

(57) ABSTRACT

To improve the adhesion resistance and wear resistance of a surface-coated cutting tool. The surface-coated cutting tool includes a tool substrate, and a single-component coating layer composed of a composite nitride of Cr (chromium), Al (aluminum), and V (vanadium) and disposed on the surface of the tool substrate. The composite nitride is characterized by being represented by a compositional formula: $Cr_aAl_bV_cN$ satisfying the following relations:

$0.11 \leq a \leq 0.26$;

$0.73 \leq b \leq 0.85$;

$0 < c \leq 0.04$; and $a+b+c \leq 1$ (Continued)

(wherein a, b, and c each represent an atomic proportion).
The single-component coating layer has both a hexagonal phase and a cubic phase.

3 Claims, 2 Drawing Sheets

(51) Int. Cl.
    *C23C 14/06*         (2006.01)
    *C23C 14/32*         (2006.01)

(52) U.S. Cl.
    CPC ........ *C23C 14/0641* (2013.01); *C23C 14/325* (2013.01); *B23C 2228/10* (2013.01)

(58) Field of Classification Search
    USPC .................... 51/307, 309; 428/697, 698, 699
    See application file for complete search history.

(56) References Cited

FOREIGN PATENT DOCUMENTS

| | | |
|---|---|---|
| JP | 2005-271190 A | 10/2005 |
| JP | 2006-26783 A | 2/2006 |
| JP | 2009-101491 A | 5/2009 |
| JP | 2011-224683 A | 11/2011 |
| JP | 2018-3046 A | 1/2018 |
| WO | 2009/047867 A1 | 4/2009 |

\* cited by examiner

SURFACE-COATED CUTTING TOOL

CROSS REFERENCE TO RELATED APPLICATIONS

This application is a National Stage of International Application No. PCT/JP2018/018255, filed on May 11, 2018, which claims priority from Japanese Patent Application No. 2017-115123, filed Jun. 12, 2017.

TECHNICAL FIELD

The present invention relates to a surface-coated cutting tool.

BACKGROUND ART

A known surface-coated cutting tool (see Patent Document 1) includes a substrate, and multiple layers (i.e., an inner layer and an outer layer) disposed on the substrate. The inner layer is formed of a compound (mainly a cubic-crystal compound) containing at least Al, at least one element of Cr and V, and one or more elements selected from among nitrogen, carbon, and oxygen. The outer layer is formed of a nitride, carbonitride, or oxycarbonitride (mainly a hexagonal compound) containing at least one element of Al, Cr, and V. The surface-coated cutting tool is characterized in that the outer layer has an Al content higher than that of the inner layer. The surface-coated cutting tool, which includes the inner and outer layers, exhibits improved adhesion resistance and wear resistance.

PRIOR ART DOCUMENT

Patent Document

Patent Document 1: Japanese Patent Application Laid-Open (kokai) No. 2006-26783

SUMMARY OF THE INVENTION

Problem to be Solved by the Invention

However, the technique disclosed in Patent Document 1 may cause impairment of the adhesion resistance of the cutting tool during a cutting process. As is generally known, the damage of a coating layer of the cutting tool occurs first at its outer layer. Specifically, the damage (e.g., peeling or wear) of the outer layer, which is mainly formed of a hexagonal compound, may occur first during a cutting process, resulting in impairment of adhesion resistance. This causes undesired peeling of the coating layer due to adhesion, leading to damage of the cutting tool. In view of the foregoing, an object of the present invention is to improve the adhesion resistance and wear resistance of a surface-coated cutting tool. The present invention can be implemented in the following modes.

Means for Solving the Problem (1) A surface-coated cutting tool (1) comprising a tool substrate, and a single-component coating layer composed of a composite nitride of Cr, Al, and V and disposed on the surface of the tool substrate, wherein the composite nitride is represented by a compositional formula: $Cr_aAl_bV_cN$ satisfying the following relations:

$0.11 \leq a \leq 0.26$;

$0.73 \leq b \leq 0.85$;

$0 < c \leq 0.04$; and $a+b+c=1$ (wherein a, b, and c each represent an atomic proportion).

Since the surface-coated cutting tool has a coating layer having a single-layer structure (hereinafter may be referred to as a "single-component coating layer") composed of a composite nitride of Cr, Al, and V having a specific composition, the surface-coated cutting tool exhibits improved adhesion resistance and wear resistance.

(2) A surface-coated cutting tool as described in claim 1, wherein the single-component coating layer has both a hexagonal crystalline phase (hereinafter referred to simply as a hexagonal phase) and a cubic crystalline phase (hereinafter referred to simply as a cubic phase).

Since the single-component coating layer of the surface-coated cutting tool has both a hexagonal phase and a cubic phase, the surface-coated cutting tool exhibits improved adhesion resistance and wear resistance.

(3) A surface-coated cutting tool as described in claim 2, wherein the single-component coating layer exhibits a peak intensity ratio (IA/IB) of 1.5 or more and 5.8 or less as determined through X-ray diffractometry, wherein IA represents the peak intensity of (111) plane of the cubic phase, and IB represents the peak intensity of (100) plane of the hexagonal phase.

The peak intensity ratio (IA/IB) corresponds to the ratio of the amount of the cubic phase to that of the hexagonal phase. A peak intensity ratio (IA/IB) of less than 1.5 causes the hexagonal phase to have a dominant influence. This may lead to a tendency of decreased hardness of the coating layer, resulting in improved adhesion resistance, but impaired wear resistance.

Meanwhile, a peak intensity ratio (IA/IB) of more than 5.8 causes the cubic phase to have a dominant influence. This may lead to an increase in hardness of the coating layer, resulting in improved wear resistance, but impaired adhesion resistance.

When the peak intensity ratio (IA/IB) falls within a range of 1.5 or more and 5.8 or less, the coating layer exhibits both adhesion resistance and wear resistance; i.e., the properties attributed to the hexagonal phase and the cubic phase, respectively.

(4) A surface-coated cutting tool as described in claim 2 or 3, wherein the single-component coating layer exhibits a peak intensity ratio (IA/IC) of 0.9 or more as determined through X-ray diffractometry, wherein IC represents the peak intensity of (200) plane of the cubic phase.

The peak intensity ratio (IA/IC) corresponds to the ratio of the peak intensity of (111) plane of the cubic phase to that of the (200) plane of the cubic phase. A non-oriented coating layer has a peak intensity ratio (IA/IC) of about 0.9. A peak intensity ratio (IA/IC) of 0.9 or more can lead to an improvement in breakage resistance.

Effects of the Invention

The present invention can achieve a surface-coated cutting tool exhibiting improved adhesion resistance and wear resistance.

MODES FOR CARRYING OUT THE INVENTION

1. Structure of Surface-Coated Cutting Tool

The surface-coated cutting tool includes a tool substrate, and a single-component coating layer composed of a composite nitride of Cr (chromium), Al (aluminum), and V (vanadium) and disposed on the surface of the tool substrate. The composite nitride is characterized by being represented by a compositional formula: $Cr_aAl_bV_cN$ satisfying the following relations:

$0.11 \leq a \leq 0.26$;

$0.73 \leq b \leq 0.85$;

$0 < c \leq 0.04$; and $a+b+c=1$ (wherein a, b, and c each represent an atomic proportion).

The term "single-component coating layer" refers to a coating layer substantially composed of a single material; i.e., a coating layer that has no interface between different components, as observed under an SEM (scanning electron microscope).

(1) Tool Substrate

No particular limitation is imposed on the tool substrate, and the tool substrate can be appropriately selected from those conventionally used widely in the field of cutting tools. Examples of preferred tool substrates include cemented carbide, cermet, sintered cubic boron nitride, ceramic materials (e.g., silicon carbide, silicon nitride, aluminum nitride, aluminum oxide, silicon carbide, titanium carbide, and composite materials thereof), and sintered diamond. Examples of the cemented carbide include WC-based cemented carbides, such as WC—Co alloys, WC—TiC—Co alloys, and WC—TiC—TaC—Co alloys.

(2) Type of Surface-Coated Cutting Tool

The surface-coated cutting tool can be applied to a variety of conventionally known cutting tools used for a cutting process. Examples of preferred surface-coated cutting tools include edge-exchangeable chips for turning or milling (e.g., cutting insert and throw-away chip), drills, end mills, metal saws, gear cutting tools, reamers, and taps.

Figure 1:
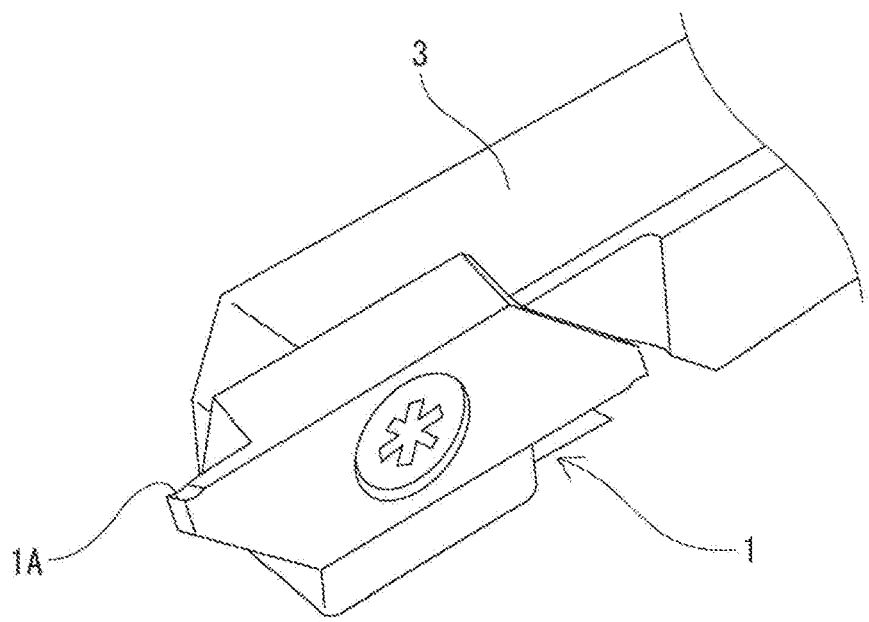
FIG. 1 Perspective view of an exemplary surface-coated cutting tool.
Figure 2:
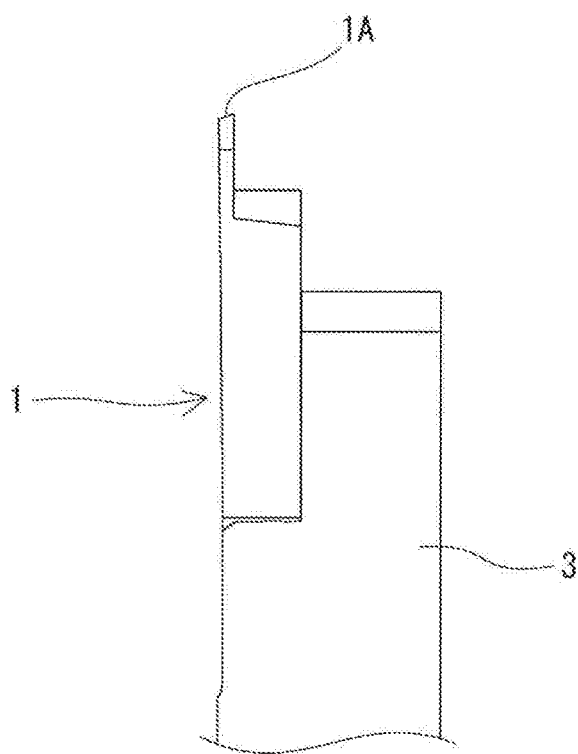
FIG. 2 Plan view of the surface-coated cutting tool.

Now will be described an exemplary surface-coated cutting tool with reference to FIGS. 1 and 2. As shown in these figures, the surface-coated cutting tool is a grooving tool (cutting insert) 1. The grooving tool 1 has an approximately parallelogram shape in side view. The grooving tool 1 has a protruding edge 1A. The grooving tool 1 is screwed into a holder 3 and is exchangeable.

(3) Coating Layer

In the surface-coated cutting tool, the coating layer is formed on the surface of the tool substrate. The coating layer has a single-layer structure and composed of a composite nitride of Cr, Al, and V. The composite nitride is represented by a compositional formula: $Cr_aAl_bV_cN$ satisfying the following relations:

$0.11 \leq a \leq 0.26$;

$0.73 \leq b \leq 0.85$;

$0 < c \leq 0.04$; and $a+b+c=1$.

In the composition $Cr_aAl_bV_cN$, a, b, and c preferably satisfy the following relations:

$0.19 \leq a \leq 0.26$;

$0.73 \leq b \leq 0.80$;

$0 < c \leq 0.03$; and $a+b+c=1$.

When a, b, and c of $Cr_aAl_bV_cN$ satisfy the aforementioned relations, the surface-coated cutting tool exhibits improved adhesion resistance and wear resistance.

When "b is less than 0.73," the coating layer has a single cubic phase, and the property of a hexagonal phase is difficult to achieve. When "b is more than 0.85," the coating layer is dominated by a hexagonal phase, and the property of a cubic phase is difficult to achieve. When b satisfies the relation "$0.73 \leq b \leq 0.85$," the single-component coating layer has both a cubic phase and a hexagonal phase and exhibits superior properties attributed to the cubic phase and the hexagonal phase.

In the coating layer, "c is more than 0"; i.e., V is an essential component. Incorporation of V can improve the slidability between the coating layer and a work material. V has a low oxidation initiation temperature and preferentially adsorbs oxygen, to thereby form $V_2O_5$. $V_2O_5$ is expected to exhibit the effect of achieving a good slidability between the coating layer and a work material. However, when c is more than 0.04, the effect of $V_2O_5$ is dominant, resulting in a tendency of decreased hardness and thermal resistance of the coating layer. When c satisfies the relation "$0 < c \leq 0.04$," a good slidability can be achieved between the coating layer and a work material while the hardness and thermal resistance of the coating layer are maintained.

No particular limitation is imposed on the thickness of the single-component coating layer composed of a composite nitride of Cr, Al, and V. The thickness of the single-component coating layer is preferably 0.5 μm or more, more preferably 0.8 μm or more, particularly preferably 1.5 μm or more, in order to secure satisfactory adhesion resistance and wear resistance. The thickness of the coating layer is generally 10 μm or less.

The thickness of the coating layer can be measured through observation of a cross section of the surface-coated cutting tool under an SEM.

Figure 3:
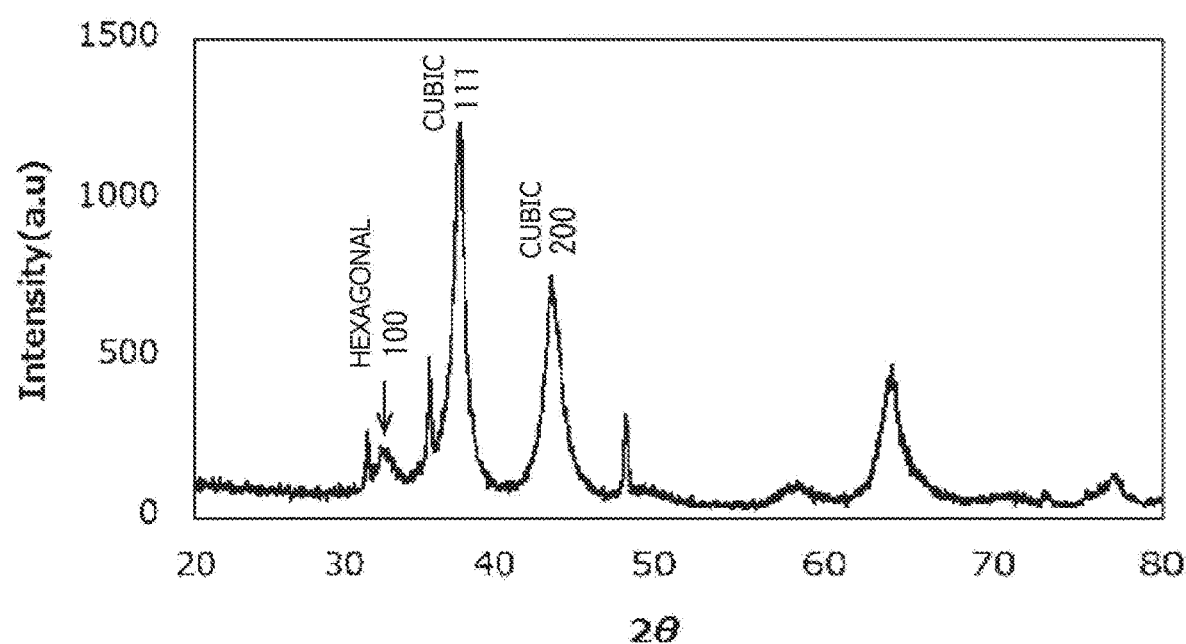
FIG. 3 Explanatory view showing the results of analysis of a coating layer through X-ray diffractometry.

The single-component coating layer has both a hexagonal phase and a cubic phase. The presence of both the hexagonal phase and the cubic phase can be determined through X-ray diffractometry of the single-component coating layer. FIG. 3 shows the results of X-ray diffraction analysis of a sample by means of an X-ray diffractometer using Cu-Kα rays. In FIG. 3, the horizontal axis corresponds to the diffraction angle 2θ of a peak, and the vertical axis corresponds to diffraction intensity. The peaks of (111) plane of the cubic phase, (200) plane of the cubic phase, and (100) plane of the hexagonal phase are observed at positions described below. The presence of the hexagonal phase and the cubic phase can be determined on the basis of the presence or absence of the peaks at these positions. In the present embodiment, the peaks attributed to the hexagonal phase and the cubic phase are observed, since the coating layer has both the hexagonal phase and the cubic phase.

Peak of (111) plane of the cubic phase: 37.7°
Peak of (200) plane of the cubic phase: 43.8°
Peak of (100) plane of the hexagonal, phase: 32.6°

In the present embodiment, the single-component coating layer preferably exhibits a specific peak intensity ratio (IA/IB) as determined through X-ray diffractometry, wherein IA represents the peak intensity of (111) plane of the cubic phase, and IB represents the peak intensity of (100) plane of the hexagonal phase. Specifically, the peak intensity ratio (IA/IB) is preferably 1.5 or more and 5.8 or less, more preferably 5.5 or more and 5.8 or less.

The peak intensity ratio (IA/IB) corresponds to the ratio of the amount of the cubic phase to that of the hexagonal phase. A peak intensity ratio (IA/IB) of less than 1.5 causes the hexagonal phase to have a dominant influence. This may lead to a tendency of decreased hardness of the coating layer, resulting in improved adhesion resistance, but impaired wear resistance.

Meanwhile, a peak intensity ratio (IA/IB) of more than 5.8 causes the cubic phase to have a dominant influence. This may lead to an increase in the hardness of the coating layer, resulting in improved wear resistance, but impaired adhesion resistance.

When the peak intensity ratio (IA/IB) falls within a range of 1.5 or more and 5.8 or less, the coating layer exhibits both adhesion resistance and wear resistance; i.e., the superior properties attributed to the hexagonal phase and the cubic phase, respectively.

In the present embodiment, the single-component coating layer exhibits a specific peak intensity ratio (IA/IC) as determined through X-ray diffractometry, wherein IC represents the peak intensity of (200) plane of the cubic phase. The peak intensity ratio (IA/IC) is preferably 0.9 or more, more preferably 1.6 or more. The upper limit of the peak intensity ratio (IA/IC) is generally 5.0.

The peak intensity ratio (IA/IC) corresponds to the ratio of the peak intensity of (111) plane of the cubic phase to that of the (200) plane of the cubic phase. A non-oriented coating layer has a peak intensity ratio (IA/IC) of about 0.9. A peak intensity ratio (IA/IC) of 0.9 or more can lead to an improvement in breakage resistance.

(4) Coating Layer Other than Single-Component Coating Layer Composed of Composite Nitride of Cr, Al, and V The surface-coated cutting tool of the present embodiment may include a coating layer (hereinafter may be referred to as "additional coating layer") other than the single-component coating layer composed of a composite nitride of Cr, Al, and V.

No particular limitation is imposed on the additional coating layer, and the additional coating layer is preferably, for example, a layer composed of TiN, TiCN, TiAlN, or CrAlN. No particular limitation is imposed on the thickness of the additional coating layer. The additional coating layer may be located inside (tool substrate side) or outside of the single-component coating layer composed of a composite nitride of Cr, Al, and V. No particular limitation is imposed on the number of layers forming the additional coating layer, and the additional coating layer may have a single-layer or multi-layer structure. When the additional coating layer has a multi-layer structure, the additional coating layer may be formed of layers having the same composition or different compositions.

(5) Effects of Surface-Coated Cutting Tool of Embodiment

In the surface-coated cutting tool of the present embodiment, the single-component coating layer composed of a composite nitride of Cr, Al, and V has both a hexagonal phase and a cubic phase. The single-component coating layer is harder than a layered film according to the aforementioned conventional technique (Patent Document 1). Conceivably, the performance of the coating layer is less likely to be impaired, and thus the coating layer contributes to an improvement in cutting ability.

The surface-coated cutting tool of the present invention exhibits adhesion resistance higher than that of a conventional product by reducing the affinity of the tool surface to a work material; i.e., by reducing the amount of an iron group element contained in the coating layer. The control of the amount of Al, Cr, or V enables the coating layer to have both a cubic phase and a hexagonal phase and to improve its properties.

Incorporation of V into the coating layer can improve the slidability between the coating layer and a work material. V has a low oxidation initiation temperature and preferentially adsorbs oxygen, to thereby form $V_2O_5$. $V_2O_5$ is expected to exhibit the effect of achieving a good slidability between the coating layer and a work material.

The breakage resistance or chipping resistance of the cutting tool is improved, and the service life of the tool is prolonged through achievement of the (111) orientation; i.e., a peak intensity ratio (IA/IC) of 0.9 or more. As used herein, the term "chipping resistance" refers to the case where a tool is less likely to be chipped.

2. Production Method for Surface-Coated Cutting Tool

No particular limitation is imposed on the method for producing the surface-coated cutting tool. For example, the single-component coating layer composed of a composite nitride of Cr, Al, and V can be formed on the surface of the tool substrate through arc ion plating. In this production method, a desired surface-coated cutting tool can be produced by controlling the conditions for forming the surface coating layer. In the present embodiment, the coating layer formed on the surface of the tool substrate is composed of a composite nitride of Cr, Al, and V and has a single-layer structure. Thus, the coating layer is formed by use of one type of target (evaporation source); specifically an alloy target containing Al, Cr, and V. This formation involves the use of nitrogen gas as a reaction gas.

EXAMPLES

The present invention will next be described in more detail by way of examples.

1. Production of Surface-Coated Cutting Tool

The tool substrate used was cemented carbide (grade: JIS K type) having a chip shape for grooving. The tool substrate was placed in a cathode arc ion plating apparatus.

While the chamber of the apparatus was evacuated by means of a vacuum pump until a pressure of $4.0 \times 10^{-3}$ Pa was achieved in the chamber, the tool substrate placed in the apparatus was heated to a temperature of 500° C. by means of a heater. Subsequently, argon gas was introduced into the apparatus so as to maintain a pressure of 1.0 Pa in the chamber, and the substrate bias voltage was gradually increased to −350 V, to thereby clean the surface of the tool substrate for 20 minutes. Thereafter, the argon gas was discharged.

Subsequently, an alloy target containing Al, Cr, and V was placed in the apparatus. While nitrogen gas serving as a reaction was introduced and the following conditions were maintained (substrate temperature: 500° C., reaction gas pressure: 1.0 Pa, and substrate bias voltage: −30 V), an arc current of 100 A was supplied to a cathode, and metal ions were generated from an arc evaporation source, to thereby form a coating layer (thickness: 1.5 nm) at a cutting edge. The evaporation source used in the present invention is characterized in that magnetic field lines extend to a work material, and the plasma density of a film formation gas in the vicinity of the work material is considerably high as compared with the case of a conventional evaporation source. Surface-coated cutting tools of Comparative Examples 1 to 4 were produced by appropriately regulating the aforementioned conditions for formation of a coating layer.

Thus, surface-coated cutting tools of Examples 1 to 4 and Comparative Examples 1 to 4 were produced as shown in Table 1. The coating layer of each of the surface-coated cutting tools was analyzed by means of an X-ray diffractometer (RINT-TTR3, manufactured by Rigaku Corporation) using Cu-Kα rays.

In Examples 1 to 4 and Comparative Examples 1 to 4, the composition and crystal phases of the surface coating layer were varied as shown in Table 1 through regulation of the proportions of Al, Cr, and V contained in the alloy target.

2. Wear Resistance Test

Each of the surface-coated cutting tools was used for cutting off under the conditions described below, and the flank wear width of the cutting edge was measured after 300 passes. The cutting conditions were as follows: work material: SUS304 (Φ20), cutting rate: 60 m/min, and feed rate: 0.05 mm/rev.

3. Test Results

Test results are shown in Table 1.

In Comparative Example 2, high Al content caused the hexagonal phase to have a dominant influence, resulting in wear.

Comparative Example 3 corresponds to the case where a conventional CrAlN coating layer was used. In Comparative Example 3, the coating layer had a single cubic phase because of the absence of V and a relatively low Al content. Thus, the property of a hexagonal phase failed to be achieved, and adhesion resistance was impaired. This led to adhesion/peeling, resulting in chipping and thus wear.

In Comparative Example 4, high V content caused the hexagonal phase to have a dominant influence, resulting in wear. In Comparative Example 4, thermal resistance was impaired.

Now will be described the effect of peak intensity ratio (IA/IB) on wear. Each of the surface-coated cutting tools of Examples 1 to 5, in which the coating layer exhibited a peak intensity ratio (IA/IB) of 1.5 or more and 5.8 or less, was found to have a small wear width.

In Comparative Examples 1 and 3, the coating layer had only a cubic phase, and thus the peak intensity ratio (IA/IB) was not calculated. Each of the surface-coated cutting tools of Comparative Examples 2 and 4, in which the coating layer exhibited a peak intensity ratio (IA/IB) of less than 1.5, was found to have a large wear width.

These results indicated that the coating layer exhibiting a peak intensity ratio (IA/IB) of 1.5 or more and 5.8 or less has both adhesion resistance and wear resistance.

Now will be described the effect of peak intensity ratio (IA/IC) on wear. Each of the surface-coated cutting tools of Examples 1 to 5, in which the coating layer exhibited a peak intensity ratio (IA/IC) of 0.9 or more, was found to have a small wear width.

Each of the surface-coated cutting tools of Comparative Examples 1 and 3, in which the coating layer exhibited a peak intensity ratio (IA/IC) of less than 0.9, was found to

TABLE 1

|  | Coating layer thickness (μm) | Composition of coating layer | Crystalline phase | IA/IB | IA/IC | Wear width (μm) |
| --- | --- | --- | --- | --- | --- | --- |
| Ex. 1 | 1.5 | $Cr_{0.26}Al_{0.73}V_{0.01}N$ | Hexagonal + cubic | 5.8 | 0.9 | 29 |
| Ex. 2 | 1.5 | $Cr_{0.17}Al_{0.82}V_{0.01}N$ | Hexagonal + cubic | 2.6 | 2.1 | 30 |
| Ex. 3 | 1.5 | $Cr_{0.23}Al_{0.75}V_{0.02}N$ | Hexagonal + cubic | 5.5 | 1.6 | 27 |
| Ex. 4 | 1.5 | $Cr_{0.21}Al_{0.75}V_{0.04}N$ | Hexagonal + cubic | 4.0 | 1.7 | 31 |
| Ex. 5 | 1.5 | $Cr_{0.11}Al_{0.85}V_{0.04}N$ | Hexagonal + cubic | 1.5 | 2.7 | 34 |
| Comp. Ex. 1 | 1.5 | $Cr_{0.34}Al_{0.65}V_{0.01}N$ | Cubic | — | 0.7 | 57 |
| Comp. Ex. 2 | 1.5 | $Cr_{0.09}Al_{0.90}V_{0.01}N$ | Hexagonal + cubic | 0.3 | 1.5 | 51 |
| Comp. Ex. 3 | 1.5 | $Cr_{0.3}Al_{0.7}N$ | Cubic | — | 0.7 | 40 |
| Comp. Ex. 4 | 1.5 | $Cr_{0.15}Al_{0.75}V_{0.1}N$ | Hexagonal + cubic | 0.7 | 1.9 | 53 |

The surface-coated cutting tools of Examples 1 to 5, in which the composition $Cr_aAl_bV_cN$ of the coating layer satisfied the following relations: $0.11 \leq a \leq 0.26$, $0.73 \leq b \leq 0.85$, and $0 < c \leq 0.04$, were found to have small wear width; i.e., improved wear resistance, as compared with the surface-coated cutting tools of Comparative Examples 1 to 4.

The surface-coated cutting tools of Examples 1 to 4 were found to generate almost no chipping, which would otherwise be caused by adhesion/peeling.

In Comparative Example 1, the coating layer had a single cubic phase because of low Al content. Thus, the property of a hexagonal phase failed to be achieved, and adhesion resistance was impaired. This led to adhesion/peeling, resulting in chipping and thus wear.

have a large wear width. In Comparative Examples 2 and 4, the peak intensity ratio (IA/IC) is 0.9 or more, but the composition of the coating layer falls outside the scope of the present invention.

These results indicated that the coating layer exhibiting a peak intensity ratio (IA/IC) of 0.9 or more has both adhesion resistance and wear resistance.

Now will be described the detailed comparison between Examples 1 and 3. In Examples 1 and 3, the peak intensity ratios (IA/IB) are approximate with each other. However, the peak intensity ratio (IA/IC) in Example 1 is 0.9, which is smaller than that in Example 3; i.e., 1.6. The wear width in Example 3 is smaller than that in Example 1. These results indicate that a peak intensity ratio (IA/IC) of 1.6 or more achieves very good wear resistance.

4. Effects of Examples

According to the present examples, the surface-coated cutting tool exhibits improved adhesion resistance and wear resistance upon cutting of a work material that is likely to cause adhesion on a cutting edge, such as low-carbon steel, stainless steel material, or ductile cast iron. Thus, the surface-coated cutting tool exhibits long service life.

In the present examples, the single-component coating layer composed of a composite nitride of Cr, Al, and V has both a hexagonal phase and a cubic phase. The single-component coating layer has adhesion resistance superior to that of the layered product according to the aforementioned conventional technique (Patent Document 1) or a cubic-phase single layer. Thus, the single-component coating layer can contribute to reduction in tool damage, which would otherwise be caused by adhesion.

The coating layer exhibiting a peak intensity ratio (IA/IC) of 0.9 or more has excellent breakage resistance and enables the tool to have prolonged service life.

Other Embodiments (Modifications)

The present invention is not limited to the examples and embodiments described above, but may be implemented in various other forms without departing from the scope of the invention.

(1) The present invention has been described by taking a grooving tool as an example in the aforementioned embodiment. However, the present invention can be applied to various cutting tools used for a cutting process.

DESCRIPTION OF REFERENCE NUMERALS

1: grooving tool
11A: edge
3: holder

The invention claimed is:

1. A surface-coated cutting tool comprising a tool substrate, and a single-component coating layer composed of a composite nitride of Cr, Al, and V and disposed on the surface of the tool substrate, wherein
the composite nitride being represented by a compositional formula: $Cr_aAl_bV_cN$ satisfying the following relations:

$0.11 \leq a \leq 0.26$;

$0.73 \leq b \leq 0.85$;

$0 < c \leq 0.04$; and $a+b+c=1$ (wherein a, b, and c each represent an atomic proportion),
wherein the single-component coating layer has both a hexagonal phase and a cubic phase, and
wherein the single-component coating layer exhibits a peak intensity ratio (IA/IB) of 1.5 or more and 5.8 or less as determined by X-ray diffractometry, wherein
IA represents the peak intensity of (111) plane of the cubic phase, and
IB represents the peak intensity of (100) plane of the hexagonal phase.

2. A surface-coated cutting tool according to claim 1, wherein the single-component coating layer exhibits a peak intensity ratio (IA/IC) of 0.9 or more as determined through X-ray diffractometry, wherein
IC represents the peak intensity of (200) plane of the cubic phase.

3. A surface-coated cutting tool comprising a tool substrate, and a single-component coating layer composed of a composite nitride of Cr, Al, and V and disposed on the surface of the tool substrate, wherein
the composite nitride being represented by a compositional formula: $Cr_aAl_bV_cN$ satisfying the following relations:

$0.11 \leq a \leq 0.26$;

$0.73 \leq b \leq 0.85$;

$0 < c \leq 0.04$; and $a+b+c=1$ (wherein a, b, and c each represent an atomic proportion),
wherein the single-component coating layer has both a hexagonal phase and a cubic phase, and
wherein the single-component coating layer exhibits a peak intensity ratio (IA/IC) of 0.9 or more as determined through X-ray diffractometry, wherein
IC represents the peak intensity of (200) plane of the cubic phase.

* * * * *